United States Patent [19]
Maeda et al.

[11] Patent Number: 4,724,337
[45] Date of Patent: Feb. 9, 1988

[54] AUTOMATIC GAIN CONTROL DETECTION CIRCUIT

[75] Inventors: Jyoji Maeda, Yokohama; Kazuo Hasegawa, Tokyo; Yasunori Miyahara, Yokohama, all of Japan

[73] Assignee: Kabushiki Kaisha Toshiba, Kawasaki, Japan

[21] Appl. No.: 844,608

[22] Filed: Mar. 27, 1986

[30] Foreign Application Priority Data

Mar. 30, 1985 [JP] Japan ................................ 60-65266

[51] Int. Cl.$^4$ .......................... H03K 5/00; H03F 3/45
[52] U.S. Cl. .................................... 307/262; 330/256
[58] Field of Search ............... 330/254, 256, 279, 289; 329/101, 163, 164, 192; 307/261, 262; 328/26; 363/127

[56] References Cited

FOREIGN PATENT DOCUMENTS 213517 12/1983 Japan .................................... 330/254
89010 5/1984 Japan .................................... 329/101

Primary Examiner—James B. Mullins
Attorney, Agent, or Firm—Oblon, Fisher, Spivak, McClelland & Maier

[57] ABSTRACT

An automatic gain control (AGC) detection circuit. The AGC detection circuit includes; a current source, first to fourth transistors whose emitters are connected in common to the current source, a reference voltage source for supplying the bases of the first and the second transistors with a reference voltage, input terminal means connected to the bases of the third and the fourth transistors for receiving an input signal, a power supply source for supplying the first to fourth transistors with a power supply voltage, first collector load means connected between the power supply source and a node connecting the collectors of the first and second transistors in common, second collector load means connected between the power supply source and another node connecting the collectors of the third and fourth transistors in common, and an output terminal means connected between the nodes for taking out an automatic gain control detection output.

5 Claims, 8 Drawing Figures

FIG. 1.

(Prior Art)

AUTOMATIC GAIN CONTROL DETECTION CIRCUIT

BACKGROUND OF THE INVENTION

1. Field of the Invention

The present invention relates to an automatic gain control detection circuit.

2. Description of Prior Art

Figure 1:
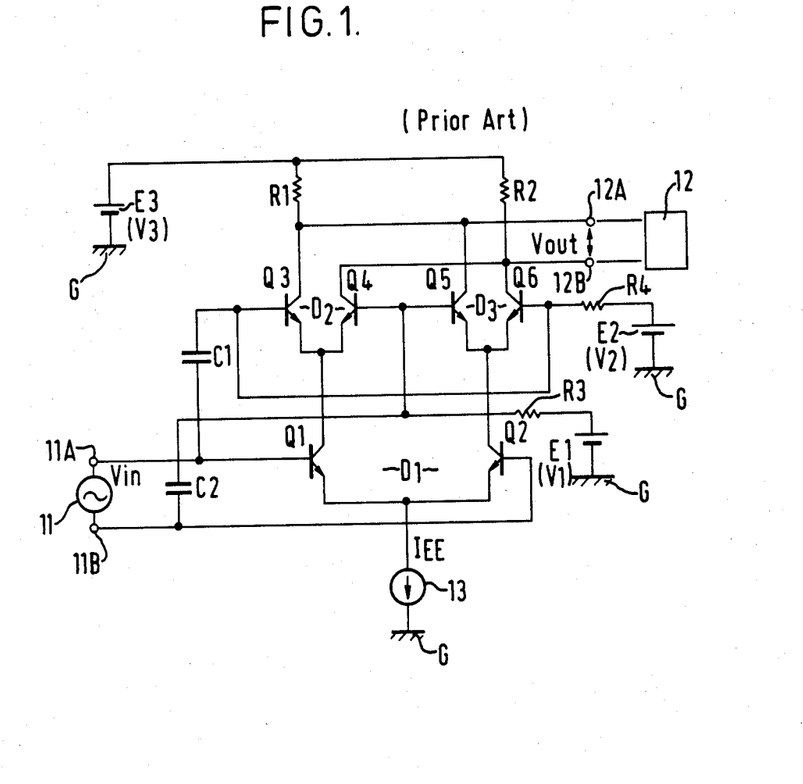
FIG. 1 is a circuit diagram showing a conventional automatic gain control (AGC) detection circuit.

There is a conventional circuit for detecting an automatic gain control (AGC) signal, for example, a circuit as shown in FIG. 1. The conventional AGC detection circuit is constituted in a well-known double balanced type multiplier circuit. The double balanced type multiplier circuit is comprised of first, second and third differential amplifiers D1 to D3. Second and third differential amplifiers D2 and D3 are respectively connected in series with two current paths of first differential amplifier D1. Transistors Q1 and Q2 constituting the first differential amplifier D1 are respectively coupled at their bases to input terminals 11A and 11B. Transistors Q3 and Q4 constituting second differential amplifier D2 are respectively coupled at their collectors to output terminals 12A and 12B. Also, transistors Q5 and Q6 constituting third differential amplifier D3 are respectively coupled at their collectors to output terminals 12A and 12B.

A first reference voltage V1 is applied from a first reference voltage source E1 to the bases of transistors Q4 and Q5 through a resistor R3. A second reference voltage V2 is applied from a second reference voltage source E2 to the bases of transistors Q3 and Q6 through a resistor R4. And a power supply voltage V3 is applied from a power supply source E3 to the collectors of transistors Q3 and Q5 through a resistor R1 and the collectors of transistors Q4 and Q6 through a resistor R2. The base of transistor Q1 is connected to the bases of transistors Q3 and Q6 through a capacitor C1, while the base of transistor Q1 is connected to the bases of transistors Q4 and Q5 through a capacitor C2. An AGC detection output Vout is obtained between the common connection node of the collectors of transistors Q3 and Q5 and the common connection node of the collectors of transistors Q4 and Q6, i.e., between output terminals 12A and 12B. The common connection node of the emitters of transistors Q1 and Q2 is connected to a current source 13.

When an input signal voltage from an input signal source 11 is given as Vin and a current generated from current source 13 is given as Iee, collector currents Ic1 to Ic6 of transistor Q1 to Q6 in above circuit are expressed as follows. (Vt is a thermal voltage of the transistors.)

$$Ic1 = \frac{Iee}{1 + \exp(-Vin/Vt)} \quad (1)$$

$$Ic2 = \frac{Iee}{1 + \exp(Vin/Vt)} \quad (2)$$

$$Ic3 = \frac{Ic1}{1 + \exp(-Vin/Vt)} \quad (3)$$

$$Ic4 = \frac{Ic1}{1 + \exp(Vin/Vt)} \quad (4)$$

$$Ic5 = \frac{Ic2}{1 + \exp(-Vin/Vt)} \quad (5)$$

$$Ic6 = \frac{Ic2}{1 + \exp(Vin/Vt)} \quad (6)$$

From Equations (1) to (6)

$$Ic3 = \frac{Iee}{[1 + \exp(-Vin/Vt)]} \quad (7)$$

$$Ic4 = \frac{Iee}{[1 + \exp(-Vin/Vt)] \cdot [1 + \exp(Vin/Vt)]} \quad (8)$$

$$Ic5 = \frac{Iee}{[1 + \exp(Vin/Vt)]} \quad (9)$$

$$Ic6 = \frac{Iee}{[1 + \exp(Vin/Vt)] \cdot [1 + \exp(-Vin/Vt)]} \quad (10)$$

Assuming a load resistance of a load circuit 12 to be connected between output terminals 12A and 12B as R1, AGC output Vout is expressed as follows.

$$\begin{aligned} Vout &= R1 \cdot Iout = R1 \cdot [(Ic3 + Ic5) - (Ic6 + Ic4)] \\ &= R1 \cdot [(Ic3 - Ic6) - (Ic4 + Ic5)] \\ &= R1 \cdot Iee \cdot [\tanh(Vin/2\,Vt)]^2 \end{aligned} \quad (11)$$

Where, Iout is an output current flowing through load circuit 12. If assuming $Vin \ll Vt$, $$Vout = R1 \cdot Iee \cdot (Vin/2Vt)^2 \quad (12)$$

When replacing input Vin to Vo sin t, $$Vout \approx R1 \cdot Iee \cdot \left(\frac{Vo \sin\omega t}{2\,Vt}\right)^2 \quad (13)$$

When AGC output Vout is taken out via a low-pass filter (not shown), the following Equation is obtained.

$$\begin{aligned} Vout &= \frac{1}{2\pi} R1\, Iee \left(\frac{Vo \sin\omega t}{2\,Vt}\right)^2 dt \\ &= \frac{R1\, Iee\, Vo}{8\pi \cdot Vt^2} \sin^2\omega t\, dt \\ &= \frac{R1\, Iee\, Vo}{8\pi \cdot Vt^2} \cdot \frac{1 - \cos\omega t}{2}\, dt \\ &= \frac{R1\, Iee\, Vo}{16\pi \cdot Vt^2} \left[t - \frac{1}{\omega}\sin\omega t\right] \\ &= \frac{R1\, Iee}{8\, Vt^2} Vo^2 \end{aligned} \quad (14)$$

As described above, it will be understood that the AGC detection circuit can obtain AGC output Vout which is proportional to the square of DC voltage component Vo of input signal Vin and simultaneously inversely proportional to the square of thermal voltage Vt of the transistors.

The conventional AGC detection circuit described above obtains ABC output Vout in proportion to $1/Vt^2$. The thermal voltage Vt of the transistors can be expressed as follows.

$$Vt = k \cdot T/q$$

where, k is the Boltzmann's constant, q is the element charge, and T is absolute temperature.

Therefore, the AGC output Vout is inversely proportional to the square of the absolute temperature T so that it varies excessively in accordance with temperature variation. Further, the DC potential of AGC output Vout becomes large so that it easily saturates to its maximum amplitude.

For solving such a problem, many improvements have been made for compensating above output variation by making the current Iee of current source 13 become proportional to the absolute temperature T.

Figure 2:
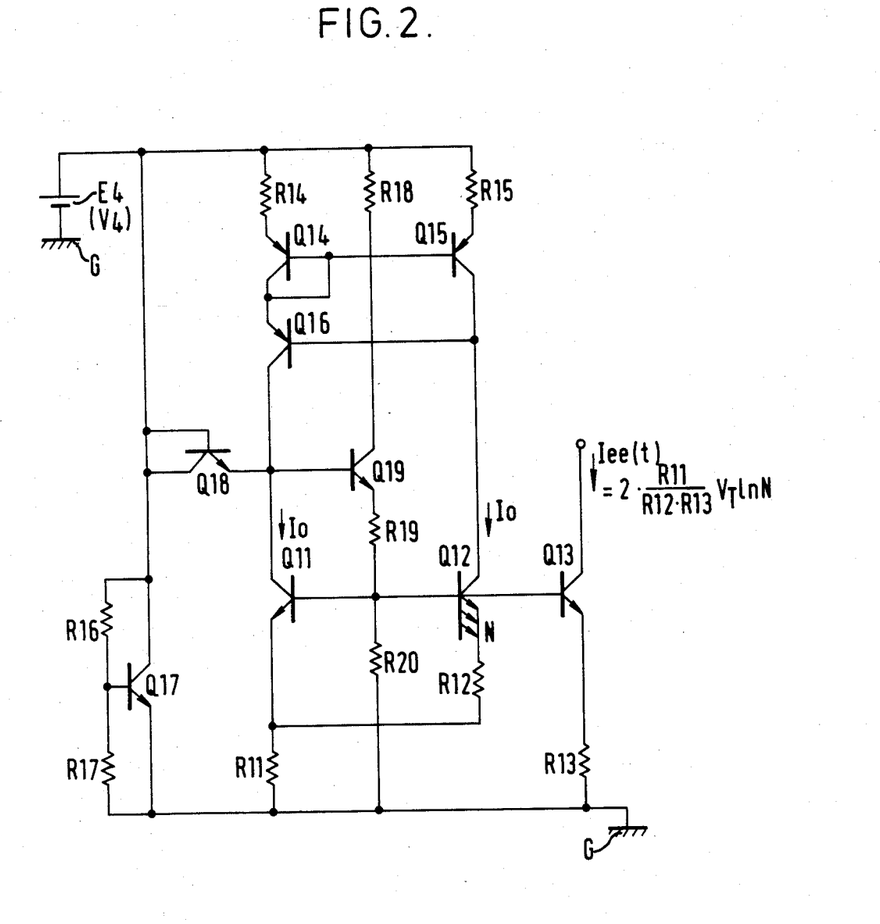
FIG. 2 is a circuit diagram showing an example of the current source circuit for producing a current proportional to a temperature variation.

As an example of the current source whose output current is proportional to the absolute temperature T, there is a circuit as shown in FIG. 2.

In FIG. 2, transistors Q11 and Q13 are same size and each emitter is grounded through resistors R11 and R13 respectively. Transistor Q12 has an emitter junction area that is N times larger than that of transistors Q11 and Q13. The emitter of transistor Q12 is connected to the emitter of transistor Q11 through a resistor R12. Transistors Q14, Q15, and Q16 and resistors R14 and R15 constitute a current mirror circuit and flow an equal current Io to the collectors of transistors Q11 and Q12. Also, transistors Q17, Q18, and Q19 and resistors R16 to R20 constitute a starter circuit.

Now, assuming Vbe11, Vbe12 and Vbe13 as voltages across the base and the emitter of respective transistors Q11, Q12 and Q13 and Is as a reverse direction saturation current of transistors Q11 and Q13, they have relations with each other as expressed below.

$$Vbe11 = Vbe12 + IoR12 \quad (15)$$

$$Vbe11 = Vbe13 = Vt \cdot \ln (Io/Is) \quad (16)$$

$$Vbe12 = Vt \cdot \ln [Io/(NIs)] \quad (17)$$

From Equations (15) to (17), $$Io = \frac{Vt \cdot \ln N}{R12} \quad (18)$$

Since Vbe11 and Vbe—are equal (see Equation (16)), the potential drops in resistors R11 and R13 are also equal. Also, since $\beta >> 0$, output current Iee(t) of the circuit, which flows through transistor Q13, is given from following Equation.

$$R13 \cdot Iee(t) \approx R11 \cdot (2 \cdot Io)$$

Therefore, $$Iee(t) = 2 \cdot \frac{R11}{R12 \cdot R13} \cdot Vt \cdot \ln N \quad (19)$$

When substituting $Vt = k \cdot T/q$, $$Iee(t) = \left(2 \cdot \frac{R11}{R12\,R13} \cdot \frac{k}{q} \cdot \ln N\right) T \quad (20)$$

Accordingly, output current Iee(t) proportional to the absolute temperature T can be obtained at the collector of transistor Q13.

When using above current source, the conventional AGC detection circuit as shown in FIG. 1 is reduced the influence due to the temperature variation until the AGC output Vout becomes proportional to the absolute temperature T. However, the problem of the influence due to the temperature variation still remains. That is, the output current Iee(t) of the circuit shown in FIG. 2 is proportional to T, but not proportional to $T^2$. So that the AGC output Vout is still suffered by the influence of the temperature variation.

As a method for further reducing the influence due to the temperature variation, it can be considered to operate second and third differential amplifiers D2 and D3 in FIG. 1 in switching operation. In this case, Equation (14) can be expressed as follows.

$$Vout \approx \frac{R1 \cdot Iee}{2\pi \cdot Vt} \cdot Vo \quad (21)$$

In this manner, the influence due to the temperature can be reduced until AGC output Vout becomes proportional to absolute temperature T.

However, for switching differential circuits D2 and D3, it is necessary to produce a switching signal of a large amplitude completely synchronized with input signal Vin. For the purpose, for example, a phase locked loop (PLL) circuit is required, but resulting in complicating the circuit. For obtaining the switching signal comparatively easily, there is a method of obtaining the switching signal by amplifying input signal Vin in an additional circuit. In this method, however, the switching signal and input signal Vin are apt to shift in their phases with each other and an error is apt to arise in AGC output Vout. In this case, the error is especially increased in high frequency region. Further, for keeping the DC levels of the input signal and for switching signal in reasonable amplitudes, many level shift circuits are required, and resulting in suffered by temperature variations in these portions.

There is a further method for reducing the influence due to the temperature variation. In the method, resistors with high resistance sufficient to neglect thermal voltage Vt are connected to the emitters of respective transistors Q1 to Q6 in series.

Assuming the resistance of the resistors as Re, and Re>>2 Vt/Iee, AGC output Vout is expressed as follows.

$$Vout = \frac{R1}{4\,Re^2 \cdot Iee} \cdot Vo^2 \quad (22)$$

For satisfying Equation (22), the condition Re>>2·Vt/Iee is required as assuming in above. For example, when current Iee=1 mA, thermal voltage Vt=26 mV, and, $2 \cdot Vt/Iee \leq 0.0\,1Re$ (condition for neglecting thermal voltage Vt, where T=300 K.). In this case, the condition Re>>5.2 k is required. For obtaining AGC output Vout=0.1 V when DC level component of the input signal Vo=0.5 V, load resistance R1=86.5 k is required in the circuit of FIG. 1 when emitter resistances Re=5.2 k are used, while load resistance R1=4.32 k in the circuit of FIG. 1. In this case, assuming that current Iee=1 mA, the voltage drop in each resistor R1, R2 in the circuit of FIG. 1 is only 2.16 V. However, when adding emitter resistances R3=5.2 k to the emitters of each transistor Q1, Q2 in series, it reaches 47 V. Considering further the saturation of the transistors, necessary power supply voltage is only 8 V or so in the circuit in FIG. 1. However, when adding emitter resistances Re=5.2 k, power supply voltage V3 is required 55 V. Therefore, the method of reducing the influence due to temperature variation by adding emitter resistances Re is not practically useful.

As described above, in conventional AGC detection circuits, a sufficient countermeasure for preventing the influence due to the temperature variation can not be obtained and an AGC detection circuit of high-precision and usable over a wide range can not be obtained. Further, it is partially possible to take a countermeasure for preventing the influence due to the temperature variation. However, various problems such as complicity of circuits, increase of power consumption, and increase of power supply voltage are produced and resulting in reducing the range of use.

SUMMARY OF THE INVENTION

An object of the present invention is to provide an automatic gain control (AGC) detection circuit relatively free from the restriction for the amplitude value of an input signal.

Another object of the present invention is to provide an AGC detection circuit sufficiently operable for an input signal of a high frequency.

Still another object of the present invention is to provide an AGC detection circuit easily able to compensate the influence due to the temperature variation at high precision.

A further object of the present invention is to provide an AGC detection circuit operable at a low power supply voltage and low power consumption.

Still another object of the present invention is to provide an AGC detection circuit suitable for fabricating the circuit with an integrated circuit (IC).

These and other objects are achieved in the AGC detection circuit of the present invention which essentially includes;

1. a Current source,
2. first to fourth transistors whose emitters are connected in common to the current source,
3. a reference voltage source for supplying the bases of the first and the second transistors with a reference voltage,
4. input terminal means connected to the bases of the third and the fourth transistors for receiving an input signal,
5. a power supply source for supplying the first to fourth transistors with a power supply voltage,
6. first collector load means connected between the power supply source and a node connecting the collectors of the first and second transistors in common,
7. second collector load means connected between the power supply source and another node connecting the collectors of the third and fourth transistors in common, and
8. an output terminal means connected between the nodes for taking out an AGC detection output.

Additional objects, advantages, and features of the present invention will further become apparent to persons skilled in the art from a study of the following description and of the accompanying drawings, in which:

DESCRIPTION OF THE PREFERRED EMBODIMENTS

The present invention will be described in detail with reference to the accompanying drawings, namely, FIGS. 2 to 8. Throughout the drawings, like reference numerals and letters are used to designate like or equivalent elements for the sake of simplicity of explanation.

Figure 3:
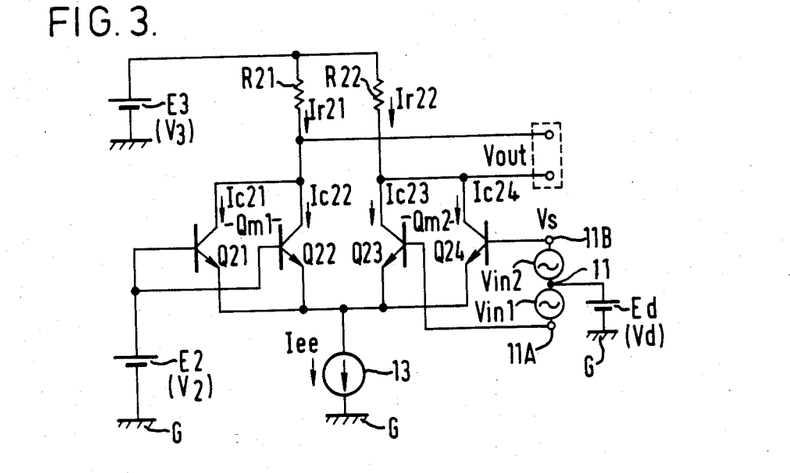
FIG. 3 is a circuit diagram showing an embodiment of an AGC detection circuit according to the present invention.

Referring now to FIG. 3, there is shown an embodiment of an AGC detection circuit according to the present invention. In the AGC detection circuit, a power supply source E3 is connected to the collectors of transistors Q21 and Q22 through a resistor R21 and also to the collectors of transistors Q23 and Q24 through a resistor R22 for supplying a power supply voltage V3. Transistors Q21 and Q22 are connected at their bases to a reference voltage source E2 with a voltage V2. Transistors Q23 and Q24 are connected at their bases to input terminals 11A and 11B which are to be connected to an input signal source 11. The emitters of transistors Q21, Q22, Q23, and Q24 are connected to the reference potential terminal G, i.e., grounded through a constant current source 13. Therefore, transistors Q21 and Q22 are connected at their collector-emitter paths in parallel with each other, and transistors Q23 and Q24 are connected at their collector-emitter paths in parallel with each other, too. While the bases of transistors Q21 and Q22 are connected to the same end of reference voltage source E2, but the bases of transistors Q23 and Q24 are connected to respective ends of input signal source 11. An AGC detection output Vout is extracted between the connection node of the collector of transistors Q21 and Q22 and the other connection node of collectors of transistors Q23 and Q24.

In a practical circuit design, transistors Q21 and Q22 are formed in a fashion of a multi-base transistor Qm1. Transistors Q23 and Q24 are also formed in the fashion of another multi-base transistor Qm2. Then respective bases of multi-base transistors Qm1 and Qm2 are connected to reference voltage source E2 or input terminals 11A and 11B.

A reference voltage V2 is supplied in common to the bases of transistors Q21 and Q22 from reference voltage source E2, and an input signal Vin is supplied between the bases of transistors Q23 and Q24 from input signal source 11. Input signal source 11 produces respectively input signals Vin1 and Vin2 with opposite phases to each other and with the same amplitudes in proportion to the absolute temperature T. Vin is used hereinsfter for representing both Vin1 and Vin2 for simplicity of explanation. Further, input terminals 11A and 11B are supplied with a DC bias Vd in addition to input signal Vin. DC bias Vd has the same value as to reference voltage V2 for matching respective transistors Q21 to Q24 in their bias conditions. Then, input signal source 11 is expressed equivalently to have two sources for applying input signals Vin1 and Vin2 and a DC bias source Ed for supplying DC voltage Vd. Then, DC bias Vd is added to input signal Vin at respective input terminals 11A and 11B. That is, $$Vin-a = Vd + Vin = Vd + Vo \sin t \quad (23)$$

where, Vin-a is the potential on input terminals 11A and 11B, and Vo is a DC component of input signal Vin as described before.

A DC transfer characteristic between input signal Vin and AGC output Vout of this circuit is described hereinafter. Assume herein the current produced from constant current source 13 as Iee, the emitter potential of transistors Q21 to Q24 as Ve, and the collector currents of transistors Q21 to Q24 as Ic21 to Ic24. Also assume all transistors Q21 to Q24 are of the same characteristic. Then, reverse direction saturation currents Is21 to Is24 and the current-amplification factors $\alpha$21 to $\alpha$24 of respective transistors Q21 to Q24 have the following relations with each other.

$$Is21 = Is22 = Is23 = Is24 = Is \quad (24)$$

$$\alpha21 = \alpha22 = \alpha23 = \alpha24 = \alpha \quad (25)$$

Then collector currents Ic21 to Ic24 of the transistors are expressed as follows.

$$Ic21 = Is \cdot \exp\frac{Vd - Ve}{Vt} \quad (26)$$

$$Ic22 = Is \cdot \exp\frac{Vd - Ve}{Vt} \quad (27)$$

$$Ic23 = Is \cdot \exp\frac{Vd - Ve + Vo}{Vt} \quad (28)$$

$$Ic24 = Is \cdot \exp\frac{Vd - Ve - Vo}{Vt} \quad (29)$$

$$Iee = \frac{1}{\alpha} \cdot (Ic21 + Ic22 + Ic23 + Ic24) \simeq \quad (30)$$

$$Ic21 + Ic22 + Ic23 + Ic24$$

As seen from Equations (26) and (27), the following relation is obtained.

$$Ic21 = Ic22 \quad (31)$$

Then, Equation (30) is expressed as follow in using above Equations (28), (29) and (31).

$$Iee = \left[ 2 \cdot Is \cdot \exp\frac{Vd - Ve}{Vt} + Is \cdot \exp\frac{Vd - Ve + Vo}{Vt} + Is \exp\frac{Vd - Ve - Vo}{Vt} \right]$$

$$= Is \cdot \exp\frac{Vd - Ve}{Vt} \cdot \left[ 2 + \exp\frac{Vo}{Vt} + \exp\frac{-Vo}{Vt} \right]$$

$$= Ic21 \cdot \left[ 2 + \exp\frac{Vo}{Vt} + \exp\frac{-Vo}{Vt} \right]$$

$$Ic21 = Ic22 = \frac{Iee}{2 + \exp(Vo/Vt) + \exp(-Vo/Vt)} \quad (32)$$

$$Ic23 = Is \cdot \exp\frac{Vd - Ve}{Vt} \cdot \exp\frac{Vo}{Vt} = Ic21 \cdot \exp\frac{Vo}{Vt} \quad (33)$$

$$= \frac{Iee \cdot \exp(Vin/Vt)}{2 + \exp(Vo/Vt) + \exp(-Vo/Vt)}$$

$$Ic24 = \frac{Iee \cdot \exp(-Vin/Vt)}{2 + \exp(Vo/Vt) + \exp(-Vo/Vt)} \quad (34)$$

Where, $$Ic21\,(Vin = 0) = Ic22\,(Vin = 0) = Ic23\,(Vin = 0) \quad (35)$$

$$= Ic24\,(Vin = 0) = Iee/4$$

$$Ic21(Vin = \pm\infty) = Ic24(Vin = \pm\infty) = 0 \quad (36)$$

$$Ic23(Vin = \pm\infty) = Ic24(Vin = -\infty) = Iee \quad (37)$$

$$Ic23(Vin = -\infty) = Ic24(Vin = +\infty) = 0 \quad (38)$$

The mutual conductances gm1 to gm4 of transistors Q21 to Q24 are expressed as follows.

$$gm1 = gm2 = \frac{dIc21}{dVin} \quad (39)$$

$$= \frac{Iee}{2 + \exp(Vo/Vt) + \exp(-Vo/Vt)}$$

$$= \frac{\frac{1}{Vt} \cdot \exp\left(\frac{Vin}{Vt}\right) - \frac{1}{Vt} \cdot \exp\left(\frac{-Vin}{Vt}\right)}{2 + \exp(Vo/Vt) + \exp(-Vo/Vt)} \cdot Iee$$

$$= \frac{\exp(-Vin/Vt) - \exp(Vin/Vt)}{[2 + \exp(Vo/Vt) + \exp(-Vo/Vt)]} \cdot \frac{Iee}{Vt}$$

For simplifying Equation, assume as $$\exp\frac{Vin}{Vt} = A, \exp\frac{-Vin}{Vt} = B$$

gm3 is obtained as follows.

$$gm3 = \frac{dIc23}{dVin} = \frac{d}{dVin} \cdot \frac{Iee \cdot \exp(Vin/Vt)}{2 + \exp(Vo/Vt) + \exp(-Vo/Vt)} \quad (40)$$

$$= \frac{\frac{1}{Vt} \cdot Iee \cdot A \cdot (2 + A + B) - Iee \cdot A \cdot \left(\frac{1}{Vt}A - \frac{1}{Vt}B\right)}{[2 + A + B]^2}$$

$$= \frac{\exp(Vin/Vt) \cdot [1 + \exp(-Vin/Vt)]}{[2 + \exp(Vo/Vt) + \exp(-Vo/Vt)]} \cdot \frac{2 \cdot Iee}{Vt}$$

$$gm4 = \frac{d}{dVin} \cdot \frac{Iee \cdot \exp(-Vin/Vt)}{2 + \exp(Vo/Vt) + \exp(-Vo/Vt)} \quad (41)$$

$$= \frac{\exp(-Vin/Vt) \cdot [1 + \exp(Vin/Vt)]}{[2 + \exp(Vo/Vt) + \exp(-Vo/Vt)]} \cdot \frac{2 \cdot Iee}{Vt}$$

From Equations (39) to (41), $$gm1(Vin = 0) = gm2(Vin = 0) = 0 \quad (42)$$

$$gm3(Vin=0)=iO/(4\ Vt) \quad (43)$$

$$gm4(Vin=0)=iO/(4\ Vt) \quad (44)$$

where, iO is a DC component of the AGC detection output current.

Figure 4:
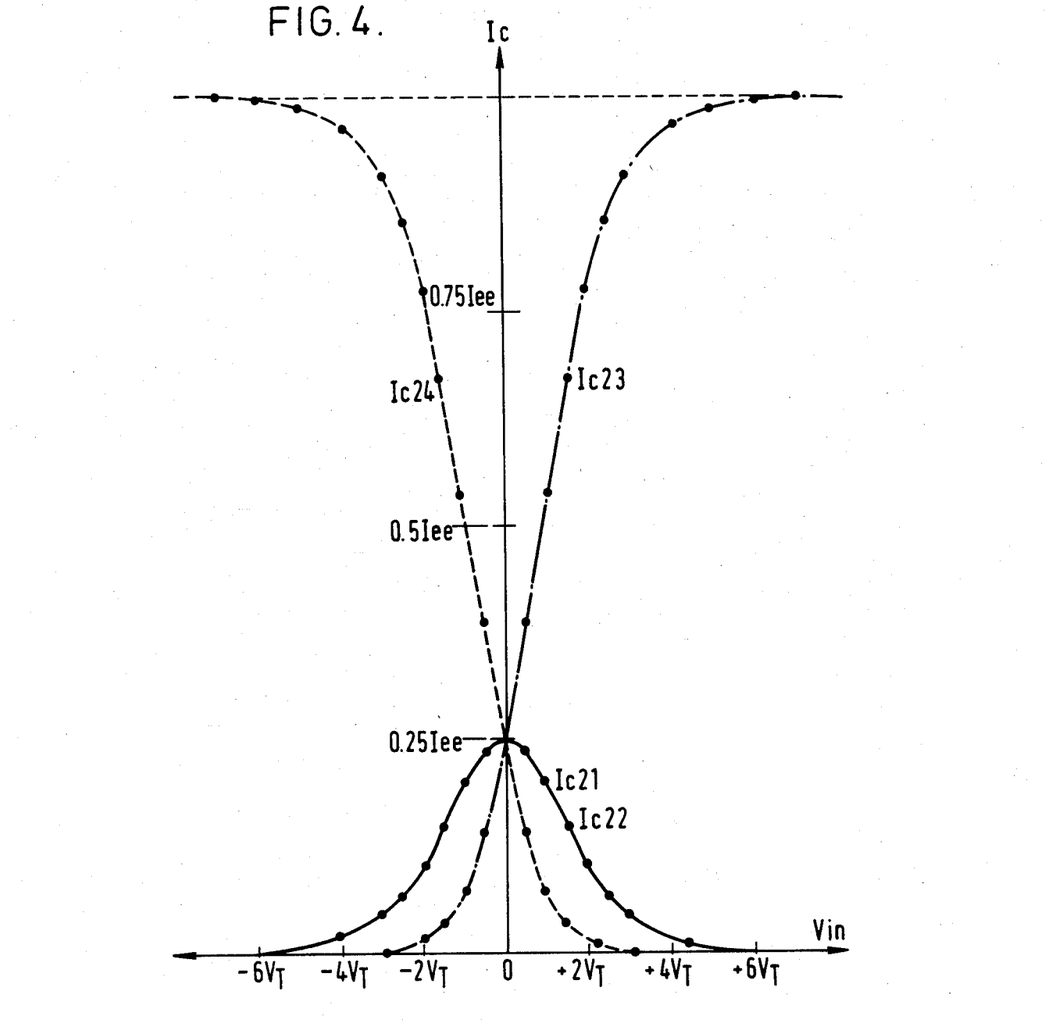
FIG. 4 is a diagram showing the characteristic of input Vin to collector currents Ic3 to Ic6 of transistors Q3 to Q6 in the circuit of FIG. 1.

From Equations (32) to (44), the DC transfer characteristic becomes such as shown in FIG. 4. The currents Ir21 and Ir22 flowing through resistors R21 and R22 are expressed as follows.

$$Ir21=Ic21+Ic22 \quad (45)$$

$$Ir22=Ic23+Ic24 \quad (46)$$

Figure 5:
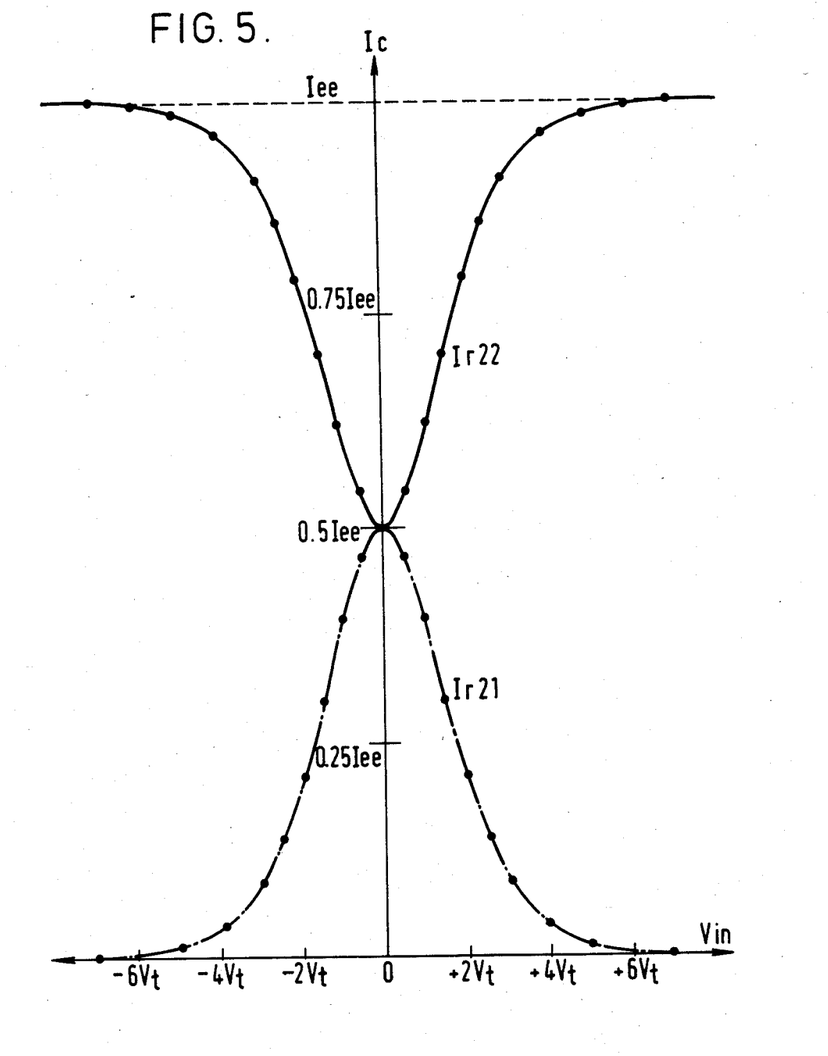
FIG. 5 is a diagram showing the characteristic of input Vin to collector currents Ic21 to Ic24 of transistors Q21 to Q24 in the circuit of FIG. 3.

The relations between input signal Vin and currents Ir21 and Ir22 are expressed as as shown in FIG. 5. The relations between currents Ir21 and Ir22 and input signal Vin can sufficiently be approximately by the following Equations.

$$Ir21 = \begin{cases} -\frac{Iee}{8\ Vt} \cdot Vo + \frac{Iee}{2} & (0 \leq Vo \leq 4 \cdot Vt) \\ \frac{Iee}{8\ Vt} \cdot Vo + \frac{Iee}{2} & (-4 \cdot Vt \leq Vo \leq 0) \end{cases} \quad (47)$$

$$Ir22 = \begin{cases} \frac{Iee}{8\ Vt} \cdot Vo + \frac{Iee}{2} & (0 \leq Vo \leq 4 \cdot Vt) \\ -\frac{Iee}{8\ Vt} \cdot Vo + \frac{Iee}{2} & (-4 \cdot Vt \leq Vo \leq 0) \end{cases} \quad (48)$$

Figure 6:
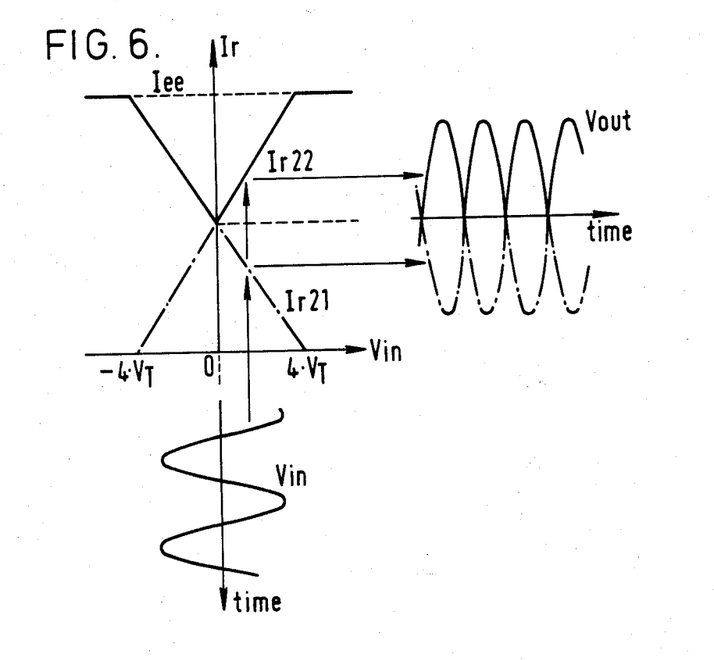
FIG. 6 is a diagram showing the DC transfer characteristic between input signal Vin and AGC output Vout in the circuit of FIG. 3.

From Equations (47) and (48), the relation between input Vin and AGC output Vout of the present invention becomes such as shown in FIG. 6. And the following relation arises.

$$Vout=R1\cdot(Ir22-Ir21) \quad (49)$$

where, R1 is the resistance value of resistors R21 and R22.

Accordingly, AGC output Vout can be obtained as a rectified signal as shown in FIG. 6. Finally AGC output Vout is obtained after passing through a low-pass filter. AGC output Vout' after the low-pass filter is expressed as follows.

$$\begin{aligned}
Vout' &= \frac{1}{2\pi} \int_0^{2\pi} Vout\ dt \quad (50) \\
&= \frac{1}{2\pi} \cdot 2 \cdot \int_0^{2\pi} R1 \cdot (Ir22 - Ir21) dt \\
&= \frac{1}{\pi} \cdot \int_0^{\pi} R1 \cdot \frac{Iee}{4\ Vt} \cdot Vin\ dt \\
&= \frac{1}{\pi} \cdot \int_0^{\pi} \frac{R1\ Iee}{4\ Vt} \cdot Vo \cdot \sin\omega t\ dt \\
&= \frac{R1\ Iee\ Vo}{4\pi \cdot Vt} \cdot \int_0^{\pi} \sin\omega t\ dt \\
&= \frac{R1 \cdot Iee}{2\pi \cdot Vt} \cdot Vo
\end{aligned}$$

Some considerations will be now made for Equation (50). As to the amplitude of input signal Vin (in the conventional AGC detection circuit, input Vin is limited its amplitude to a relatively low level), the AGC detection circuit of the above embodiment shown in FIG. 3 can operate for a relatively large amplitude input signal Vin by applying some circuit design techniques as described before in reference to the conventional AGC detection circuit shown in FIG. 1. That is, some countermeasures such as changing current Iee of current source 13, changing resistance R1, or connecting resistors Re to the emitters of transistors Q21 to Q24 in series for adjusting the gain and the dynamic range of the circuit, likely to manners usuable in a usual differential amplifier. Since the AGC detection circuit of the embodiment is of the differential amplifying circuit type, it is operable for input signal Vin at a relatively high frequency region.

Further, the AGC detection circuit of the embodiment is simple in its circuit arrangement. The AGC detection circuit of the embodiment is operable at a low power consumption and a low power supply voltage and suitable for fabrication with IC. Also, since AGC detection output Vout obtained by the AGC detection circuit of the embodiment is proportional to the absolute temperature as seen from Equation (50), the influence due to the temperature variation can be easily compensated by using a known bandgap type current source such as shown in FIG. 2 as current source 13 of FIG. 3.

Regarding to the characteristic change of AGC detection output Vout due to temperature variation, mutual conductances gm1 to gm4 of transistors Q21 to Q24 in the circuit of FIG. 3 are determined by Equations (39) to (41). As seen from Equations (39) to (41), when input signal Vin and current Iee of current cource 13 in the circuit of FIG. 3 are made to proportion to the absolute temperature T, the characteristic changes of input signal Vin and current Iee due to the temperature variation cancel each other. Therefore, mutual conductances gm1 to gm4 of transistors Q21 to Q24 become free from the influence of the temperature variation. Then, AGC detection output Vout becomes free from the influence of the temperature variation. The example of the current cource having the characteristic that the current Iee proportions to the absolute temperature T is shown in FIG. 2 and already explained before.

Figure 8:
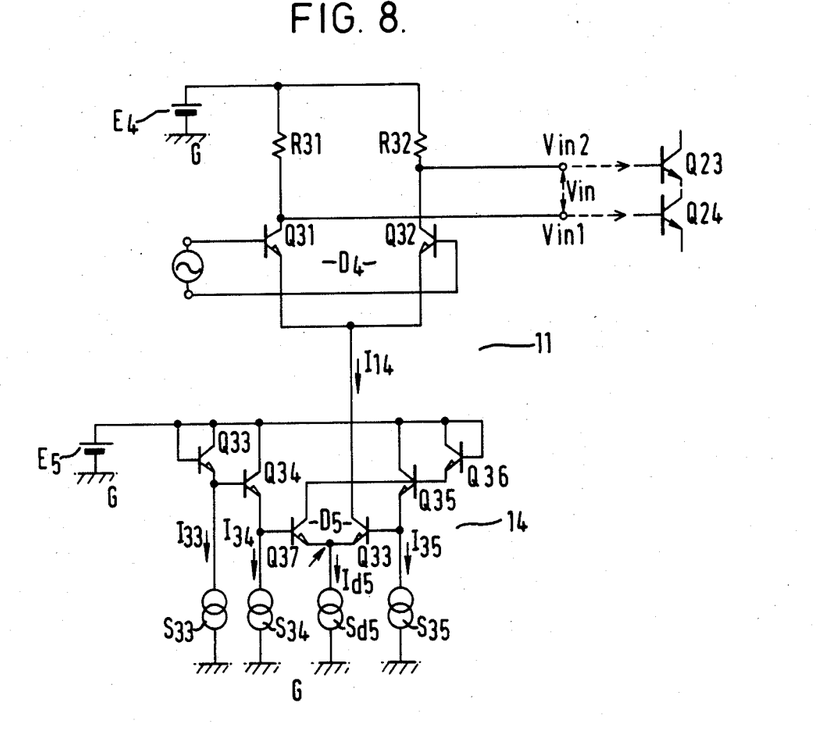
FIG. 8 is a circuit diagram showing a differential amplifier circuit for compensating the temperature characteristic.

Referring now to FIG. 8, an example of the signal input circuit 11 for making input signal Vin vary in proportion to the absolute temperature T will be explained. The circuit shown in FIG. 8 is basically constituted by a differential amplifier D4 and a current source 14.

Differential amplifier D4 is comprised of transistors Q31 and Q32 whose emitters are commonly connected to current source 14. Their collectors are connected to a power supply source E4 with a voltage V4 respectively through resistors R31 and R32. Their emitters are connected in common to aforementioned current source 14. Input signal Vin is applied between the bases of transistors Q31 and Q32, while the collectors of transistors Q31 and Q32 are connected to the bases of transistors Q23 and Q24 in the circuit shown in FIG. 3 for supplying outputs Vin1(t) and Vin2(t) of the circuit. Outputs Vin1(t) and Vin2(t) are of the opposite phases with each other but of the same amplitude, and Vin(t) is used hereinafter for representing both Vin1(t) and Vin2(t) for simplicity of explanation. Vin(t) becomes proportional to the absolute temperature T as described later.

Current source 14 is comprised of transistors Q33 to Q38. Transistor Q33 is connected at its base and collector to a power supply source E5 with a voltage V5 and at its emitter to reference potential terminal G through a constant current source S33 with a constant current I33. Transistor Q34 is connected at its collector to power supply source E5, at its base to the emitter of transistor Q33 and at its emitter to reference potential terminal G through a constant current source S34 with a constant current I34. Transistor Q35 is connected at its collector to power supply source E4 and at its emitter to reference potential terminal G through a constant current source S35 with a constant current I34. Transistor Q36 is connected at its base and collector to power supply source E5 and at its emitter to the base of transistor Q35. Transistors Q37 and Q38 are connected at their emitters in common and then connected to reference potential terminal G through constant current source Sd5 with a constant current Id5. So that they constitute a differential amplifier D5. Transistor Q37 is connected at its collector to the base of transistor Q35 and at its base to the emitter of transistor Q34. While transistor Q38 is connected at its collector to the bases of transistors Q31 and Q32 in differential amplifier D4 and at its base to the emitter of transistor Q35.

The operation of the signal input circuit shown in FIG. 8 will be described in detail. The output of differential amplifier D4, i.e., input signal Vin(t) for the AGC detection circuit of FIG. 3 is given in regard to its amplitude as follow.

$$Vin(t) = Vin \cdot gm \cdot R1 = Vin \cdot (I14/Vt) \cdot R31 \tag{51}$$

where I14 is a current supplied from current source 14 to differential amplifier D4.

For current I14, assuming transistors Q33 to Q38 to be the same size, reverse direction saturation currents Is33 to Is38 of transistors Q33 to Q38 being given as follows, $$Is33 = Is34 = Is35 = Is36 = Is37 = Is38 \tag{52}$$

In this case, the emitter potentials Ve37 and Ve38 of transistors Q37 and Q38 are the same and represented as a potential Vd5 on the terminal of current source Sd5. Assuming the base-emitter voltages of transistors Q33 to Q38 as Vbe33 to Vbe38, the following Equations are established.

$$V5 - Vd5 = Vbe33 + Vbe34 + Vbe37$$

$$= Vbe36 + Vbe35 + Vbe38$$

where Vd4 is a potential representing the same emitter potentials Ve31 and Ve32 of transistors Q31 and Q32 in differential amplifier D4.

When expressing the Vbe by using constant currents I33, I34, I35 and Id5 of current sources S33, S34, S35 and Sd5, $$Vt \cdot \ln \frac{I33}{Is33} + Vt \cdot \ln \frac{I34}{Is34} + Vt \cdot \ln \frac{Id5 - I14}{Is37} =$$

$$Vt \cdot \ln \frac{I14}{Is36} + Vt \cdot \ln \frac{I35}{Is35} + Vt \cdot \ln \frac{Id5 - I14}{Is38}$$

From Equation (52), following relations are obtained.

$$I33 \cdot I34 \cdot (Id5 - I14) = I14 \cdot I35 \cdot (Id5 - I14) I14 = (I34 \cdot I33)/I35 \tag{53}$$

Substituting Equation (53) for Equation (51), $$Vin(t) = Vin \cdot \frac{I34 \cdot I33}{Vt \cdot I35} \cdot R31 \tag{54}$$

Figure 7:
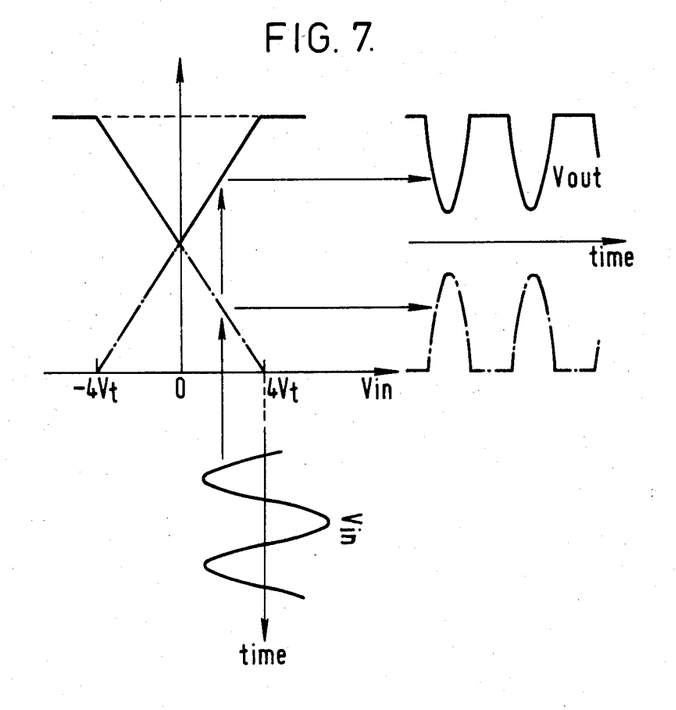
FIG. 7 is a diagram showing the DC transfer characteristic between input signal Vin and AGC output Vout in another embodiment of the AGC detection circuit according to the present invention.

When current sources S33 and S34 are constituted in using the band-gap type constant current source as shown in FIG. 7, the following Equation is obtained.

$$Vin(t) = Vin \cdot \left(2 \frac{R11}{R12\,R13} \cdot Vt \cdot \ln N\right)^2 \cdot \frac{1}{Vt \cdot I35} \cdot R31 \tag{55}$$

$$= Vin \cdot \left(2 \cdot \frac{R11}{R12\,R13} \cdot \ln N\right)^2 \cdot \frac{Vt}{I35} \cdot R31$$

Accordingly, by using a current source which is uninfluenced by the factor of temperature coefficient as constant current source S35, the output of the input signal circuit shown in FIG. 8, i.e., input signal Vin(t) for the AGC detection circuit shown in FIG. 3 becomes proportional to thermal voltage Vt.

In such a manner as above, by connecting signal Vin(t) outputted from input signal circuit shown in FIG. 8 to make the signal input Vin proportional to the absolute temperature T and further current Iee proportional to the absolute temperature T, the temperature coefficients of the mutual conductances gm1 to gm4 of the AGC detection circuit become zero, and a stable operation for the temperature can be obtained.

According to the embodiment of the present invention, the AGC detection circuit as shown in FIG. 3 is constituted by only four transistors. However, the characteristic required for the temperature stabilization is satisfied if collector currents Ic21 to Ic24 respectively flowing through transistors Q21 to Q24 are the same when AC input is zero. That is, the following equation will be established.

$$Ic = Is \cdot \exp \frac{Vd - Ve}{Vt}$$

where Ic represents the same current for collector currents Ic21 to Ic24. Then, the following equation is also established.

$$Is1 + Is2 = 2\, Is3 = 2\, Is4$$

As understood from the above equation, it is required that respective reverse direction saturation currents Is23 and Is24 of two transistors Q23 and Q24 in the differential amplifier connected to signal input circuit 11 are the same and the sum of reverse direction saturation currents Is21 and Is22 of two transistors Q21 and Q22 in the differential amplifier or multi-base transistor Qm1 connected to reference voltage source E2 is two times of reverse direction saturation current Is23 or Is24. The reverse direction saturation current Is of transistors depends on the emitter area of the transistor. Accordingly, if the relation between reverse direction saturation currents Is21 to Is24 as described above is satisfied, there is no restriction in regard to the other characteristics of transistors.

Further, AGC detection output Vout of the circuit shown in FIG. 3 is extracted to output terminals 12A and 12B as two outputs related differentially each other. But a single output may be used. Also, the AGC detection output is given as a voltage output, but it may be given as a current output, as being clear from the fact that the various characteristics in the circuit of FIG. 3 are analyzed based on the relations between the currents.

The present invention is not limited to the embodiments described above. AGC detection outputs of different types can be obtained by changing the potentials of constant voltage sources or the amplitude of the input signal.

For simplifying the description, let it now be assumed that there is no change in the connection of the circuit, resistances of resistors R11 and R12, current Iee of constant current source 13, voltage V3 of power supply source E3, and input signal Vin of input signal source 11.

As shown in Equation (23), potential Vin-a of the signal input source is as follows.

$$Vin-a = Vd + Vin = Vd + Vo \cdot \sin \omega t \quad (23)$$

On the other hand, reference voltage V2 of reference voltage source E2 is set as follows, $$V2 = Vd + Vx \quad (56)$$

That is, bias voltages for multi-base transistors Qm1 and Qm2 are set to be differentiated each other by voltage Vx. Voltage Vx operates as a base bias shift voltage.

Further, for simplifying the description, assuming that Vx=4 Vt (Vt; thermal voltage), the input to output transfer characteristic in the embodiment becomes such as shown in FIG. 7, where the abscissa in the drawing shows the base potential difference between multi-base transistors Qm1 and Qm2.

As shown in FIG. 7, AGC output Vout is obtained as a half-wave rectified signal of input signal Vin. When the rectified signal is processed by a low-pass filter, the AGC detection output is finally obtained as follows.

$$Vout' = \frac{1}{2\pi} \cdot \int_0^{2\pi} Vout \cdot dt \quad (57)$$

$$= \frac{1}{2\pi} \cdot \left[ \int_0^{\pi} \{R1 \cdot Iee - R1 \cdot (Ir22 - Ir21)\} \cdot dt + \int_0^{2\pi} R1 \cdot Iee \cdot dt \right]$$

$$= \frac{1}{2\pi} \int_0^{\pi} \left( R1 \cdot Iee - \frac{R1 \cdot Iee}{4 \cdot Vt} \cdot Vo \cdot \sin\omega t \right) \cdot dt + \int_0^{2\pi} R1 \cdot Iee \cdot dt$$

$$= \frac{1}{2\pi} \cdot \left[ \left( R1 \cdot Iee \cdot \int_0^{2\pi} dt - \frac{R1 \cdot Iee}{4 \cdot Vt} \cdot Vo \cdot \int_0^{\pi} \sin\omega t \cdot dt \right) \right]$$

$$= R1 \cdot Iee \cdot \left( 1 - \frac{Vo}{4\pi \cdot Vt} \right)$$

Considering the change of the output according to the input signal only, the term of R1 Iee on the right side is constant and then it may be neglected. Assuming the input in the condition as Vin-b, it is expressed as follows $$Vin-b = \frac{R1 \cdot Ic}{4\pi \cdot Vt} \cdot Vo \quad (58)$$

When comparing Equation (58) with Equation (50), 2 in Equation (50) is replaced to 4 in Equation (58), but the others are remained in unchanged. Therefore, the AGC detection circuit in the embodiment has the same characteristic and effect as the embodiment described before. In above embodiment, description is made regarding the case when base bias shift voltage Vx=4 Vt. However, in the case of base bias shift voltage Vx other than the above, there is no change in the fundamental operation except the difference in DC offset quantity.

As described above, according to the present invention, it is possible to provide an AGC detection circuit wides in the output amplitude and the signal input condition than those of conventional ones, high in precision, easy to compensate an output variation due to temperature, simple in circuit structure, little in power consumption, operable at a low voltage, and suitable for fabrication with IC.

We claim:

1. An automatic gain control detection circuit, comprising:
    a current source,
    first to fourth transistors whose emitters are connected in common to said current source,
    a single reference voltage source connected to the bases of said first and said second transistors for supplying said first and second transistors with a single reference voltage,
    input terminal means connected to the base of said third and said fourth transistors for receiving an input signal,
    a power supply source for supplying said first to fourth transistors with a power supply voltage,
    first collector load means connected between said power supply source and a node connecting the collectors of said first and second transistors in common,
    second collector load means connected between said power supply source and another node connecting the collectors of said third and fourth transistors in common, and
    an output terminal means connected between said nodes for taking out an automatic gain control detection output.

2. An automatic gain control detection circuit detection circuit according to claim 1, wherein said third and fourth transistors are set with their base potentials equal to said reference voltage.

3. An automatic gain control detection circuit detection circuit according to claim 1, wherein said third and fourth transistors are set with their base potentials to have a predetermined potential difference from said reference voltage.

4. An automatic gain control detection circuit detection circuit according to claim 1, wherein said automatic gain control detection circuit further comprises an input signal processing circuit which provides said input terminals with the input signal proportional to the absolute temperature.

5. An automatic gain control detection circuit as claimed in claim 1, in which said current source provides a current proportional to the absolute temperature.

* * * * *